(12) United States Patent
Sawanobori et al.

(10) Patent No.: US 7,825,575 B2
(45) Date of Patent: Nov. 2, 2010

(54) SOLID-STATE ELEMENT DEVICE AND LIGHT-EMITTING APPARATUS USING SAME

(75) Inventors: Naruhito Sawanobori, Saitama-ken (JP); Masaaki Ohtsuka, Saitama-ken (JP); Kazuya Aida, Saitama-ken (JP); Hiroko Sakaji, Saitama-ken (JP); Hiroki Watanabe, Saitama-ken (JP); Seiji Yamaguchi, Aichi-ken (JP); Yoshinobu Suehiro, Aichi-ken (JP); Koji Tasumi, Aichi-ken (JP)

(73) Assignees: Sumita Optical Glass, Inc., Saitama-shi, Saitama-ken (JP); Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 959 days.

(21) Appl. No.: 11/517,588

(22) Filed: Sep. 8, 2006

(65) Prior Publication Data

US 2007/0064131 A1    Mar. 22, 2007

(30) Foreign Application Priority Data

Sep. 13, 2005    (JP) .............................. 2005-264896

(51) Int. Cl.
 *H05B 33/00* (2006.01)
(52) U.S. Cl. .................................................. 313/498
(58) Field of Classification Search ................. 313/512, 313/498
See application file for complete search history.

(56) References Cited

U.S. PATENT DOCUMENTS

| 2,681,861 | A * | 6/1954 | Hushley ....................... 501/77 |
| 6,121,636 | A * | 9/2000 | Morita et al. ................. 257/99 |
| 6,462,358 | B1 * | 10/2002 | Lin et al. ....................... 257/99 |
| 6,462,385 | B1 * | 10/2002 | Kumagai ..................... 257/372 |
| 6,909,234 | B2 * | 6/2005 | Chen ........................... 313/512 |
| 2003/0030060 | A1 * | 2/2003 | Okazaki ....................... 257/79 |
| 2004/0257797 | A1 * | 12/2004 | Suehiro et al. ................ 362/34 |
| 2006/0012299 | A1 * | 1/2006 | Suehiro et al. .............. 313/512 |

FOREIGN PATENT DOCUMENTS

| JP | 2005-011953 | 1/2005 |
| JP | 2005-223222 | 8/2005 |
| WO | WO 2004100213 A2 * | 11/2004 |

OTHER PUBLICATIONS

Japanese Office Action dated Aug. 10, 2010 (with a partial English translation).

* cited by examiner

*Primary Examiner*—Toan Ton
*Assistant Examiner*—Hana S Featherly
(74) *Attorney, Agent, or Firm*—McGinn IP Law Group, PLLC

(57) ABSTRACT

A solid-state element device having: a solid-state element; a power receiving/supplying portion for mounting thereto the solid-state element, and receiving/supplying a power from/to the solid-state element; and a wavelength converting portion having a phosphor layer formed inside a sealing glass having the same coefficient of thermal expansion as that of the power receiving/supplying portion for sealing the solid-state element, the phosphor layer being obtained by mixing a glass and a phosphor with each other, and melting the glass.

20 Claims, 13 Drawing Sheets

SOLID-STATE ELEMENT DEVICE AND LIGHT-EMITTING APPARATUS USING SAME

The present application is based on Japanese patent application No. 2005-264896, the entire contents of which are incorporated herein by reference.

BACKGROUND OF THE INVENTION

1. Field of the Invention

The invention relates to a solid-state element device in which a phosphor-absorbs a light radiated by a light-emitting diode (hereinafter referred to as "an LED") element and wavelength-converts the light thus absorbed into a light having a different wavelength to radiate the resulting light, and a light-emitting apparatus using the same.

2. Description of the Related Art

With regard to a light-emitting apparatus in which a phosphor wavelength-converts a light radiated from an LED element to radiate the resulting light, for example, a light-emitting apparatus is known in which after a phosphor solution is made to adhere like a thin film to a surface of a glass sheet through screen printing, another glass sheet is stacked up on that glass sheet and the thin film-like phosphor is thermally fused to form a wavelength converting portion, and the resulting wavelength converting portion is sealed on a lead frame having an LED element installed thereon, so that a light resistance property and a uniform wavelength conversion property are obtained. This light-emitting apparatus, for example, is disclosed in JP-A-2005-11953.

However, when the glass sealing construction is adopted, the conventional light-emitting apparatus involves the following problems.

(1) The phosphor is not uniformly dispersed into the glass since a viscosity of the glass is high at a sealing temperature or so (at about 600° C.).

(2) In order to reduce the viscosity of the glass until the phosphor is uniformly dispersed into the glass, a high temperature of 900° C. or more is required. However, at such a high temperature, there is encountered such a problem that not only the electrodes of the LED element cannot withstand the sealing processing, but also the phosphor and the glass chemically react with each other.

(3) When a glass having such a viscosity that the phosphor is uniformly dispersed into the glass even at a low temperature is used as a sealing material, since a differential thermal expansion between a ceramic base and the LED element is generally large, cracks occur in the glass, and thus the satisfactory glass sealing cannot be performed.

SUMMARY OF THE INVENTION

It is therefore an object of the invention to provide a solid-state element device in which a phosphor can be uniformly dispersed into a glass, and a light-emitting apparatus using the same.

(1) According to one embodiment of the invention, there is provided a solid-state element device, including; a solid-state element; a power receiving/supplying portion for mounting thereto the solid-state element, and receiving/supplying a power from/to the solid-state element: and a wavelength converting portion having a phosphor layer formed inside a sealing glass having the same coefficient of thermal expansion as that of the power receiving/supplying portion for sealing the solid-state element, the phosphor layer being obtained by mixing a glass and a phosphor with each other, and melting the glass.

(2) According to another embodiment of the invention, there is provided a solid-state element device, including: a solid-state element; a power receiving/supplying portion for mounting thereto the solid-state element, and receiving/supplying a power from/to the solid-state element; and a wavelength converting portion having a fluorescent member obtained by mixing a glass and a phosphor with each other, and melting the glass, the fluorescent member being provided so as to divide an inside or outside of a sealing glass for sealing the solid-state element into two parts, or being formed so as to seal the whole sealing glass by itself.

(3) According to still another embodiment of the invention, there is provided a light-emitting apparatus, in which a plurality of solid-state element devices described above are disposed on a common power receiving/supplying portion so that light radiation directions are identical to one another.

(4) According to yet another embodiment of the invention, there is provided a light-emitting apparatus, including: a solid-state element device described above; a second power receiving/supplying portion for mounting thereto the one or plurality of solid-state element devices, and receiving/supplying a power from/to a first power receiving/supplying portion for the one or plurality of solid-state element devices; and a main body for accommodating therein the one or plurality of solid-state element devices and the second power receiving/supplying portion.

ADVANTAGES OF THE INVENTION

According to the solid-state element device of the invention, the phosphor can be uniformly dispersed into the glass. Therefore, the sealing can be performed at a temperature at which no chemical reaction occurs between the sealing glass and the phosphor, and also the property of the phosphor can be prevented from being deteriorated.

In addition, according to the light-emitting apparatus of the invention, the solid-state element device is used in which the phosphor can be uniformly dispersed into the glass, which results in that the property of the used solid-state element can be prevented from being deteriorated.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment (Construction of Solid-State Element Device)

Figure 1A:
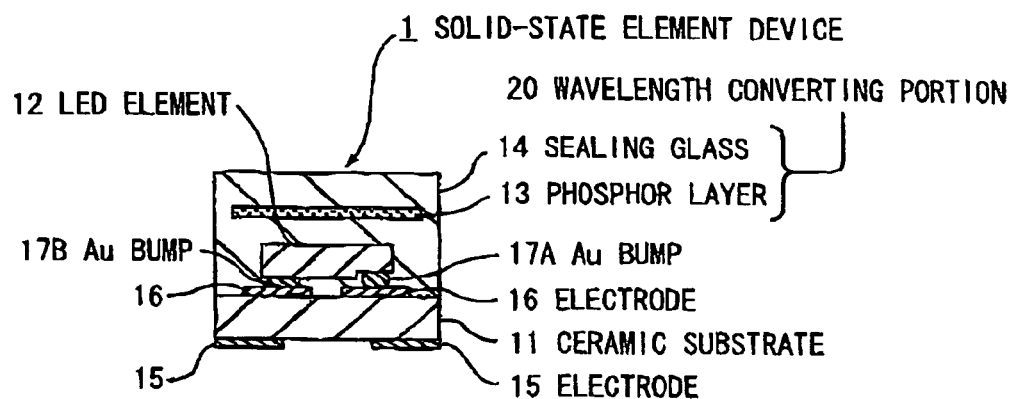
FIGS. 1A and 1B are respectively a cross sectional view showing a solid-state element device in a first preferred embodiment according to the invention, and a bottom view showing a solid-state element in the solid-state element device shown in FIG. 1A.
Figure 1B:
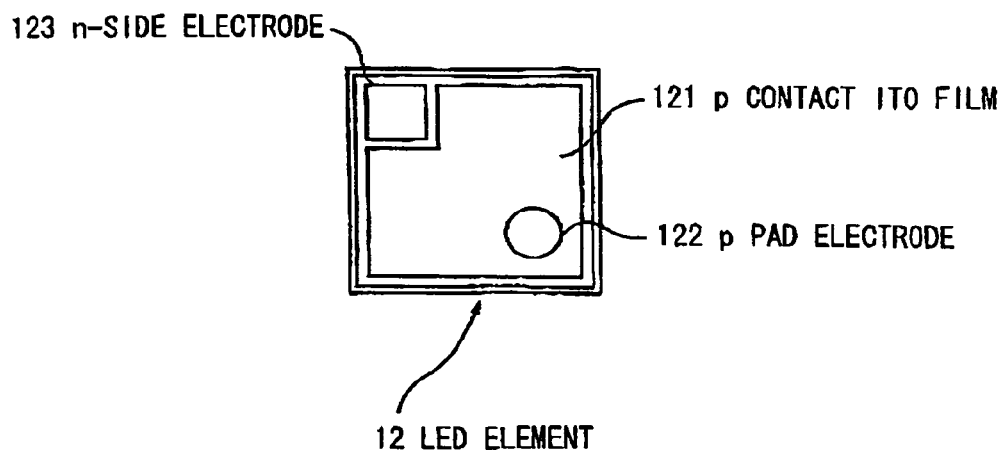

FIGS. 1A and 1B are respectively a cross sectional view showing a solid-state element device in a first embodiment according to the invention, and a bottom view showing a solid-state element in the solid-state element device shown in FIG. 1A.

As shown in FIG. 1A, a solid-state element device 1 includes a ceramic substrate 11 as a power receiving/supplying portion, an LED element 12, as a solid-state element, which is installed on the ceramic substrate 11, and a sealing glass 14, as a glass sealing portion, which has a phosphor layer 13 in its inside. Here, the phosphor layer 13 and the sealing glass 14 constitute a wavelength converting portion 20.

Electrodes 15 which, when the solid-state element device 1 is mounted to a circuit board or the like, are used for connection to the circuit board or the like are provided on a lower surface of the ceramic substrate 11. Wirings connected to the electrodes 15 and the LED element 12 and through holes (which are both not shown), and the like are formed inside the ceramic substrate 11. Moreover, electrodes 16 for electrical connection to the LED element 12 are provided on an upper surface of the ceramic substrate 11.

The LED element 12 comprises a GaN system semiconductor compound, and emits a light through its upper surface. As shown in FIG. 1B, a p contact indium tin oxide (ITO) film 121 is formed on a lower surface of the LED element 12, and a p pad electrode 122 made of Au is provided in a part of the p ITO film 121. In addition, an n-side electrode 123 is provided in a diagonal position of the p pad electrode 122. Au bumps 17A and 17B which are connected to the electrodes 16, respectively, are also connected to the p pad electrode 122 and the n-side electrode 123, respectively. Note that, the LED element 12 may be a light-emitting element (for example, a laser element) which operates in accordance with any other principle of operation, or may be a light-receiving element. In addition, any other suitable conductive material such as Rh may also be used instead of ITO.

In order to obtain a satisfactory adhesiveness to the sealing glass 14, a phosphor containing therein a glass filler is used for the phosphor layer 13. For example, yttrium aluminum garnet (YAG) activated with cerium (Ce) or the like can be used for the phosphor.

The sealing glass 14, for example, is a transparent and colorless low-melting point glass. A glass having the same coefficient of thermal expansion (for example, $7 \times 10^{-6}/°$ C.) as that of the ceramic substrate 11 is used as the sealing glass 14.

Figure 2:
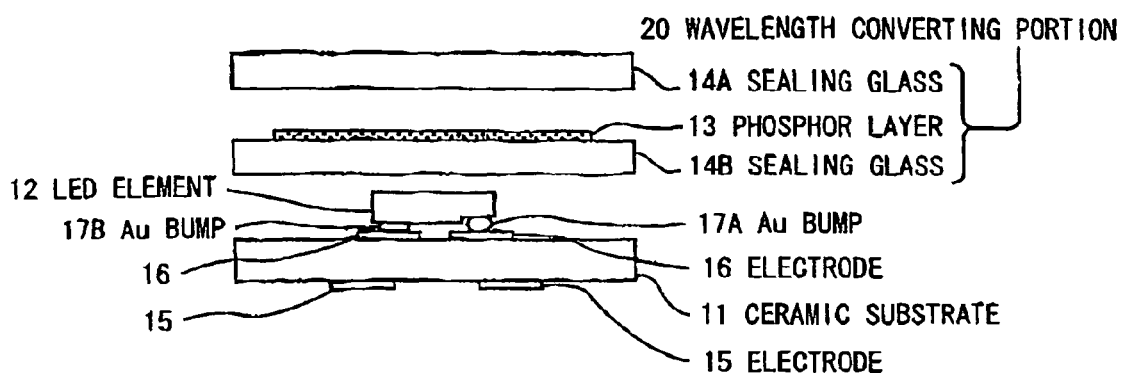
FIG. 2 is a schematic view showing processes for fabricating the solid-state element device in FIGS. 1A and 1B.
Figure 13:
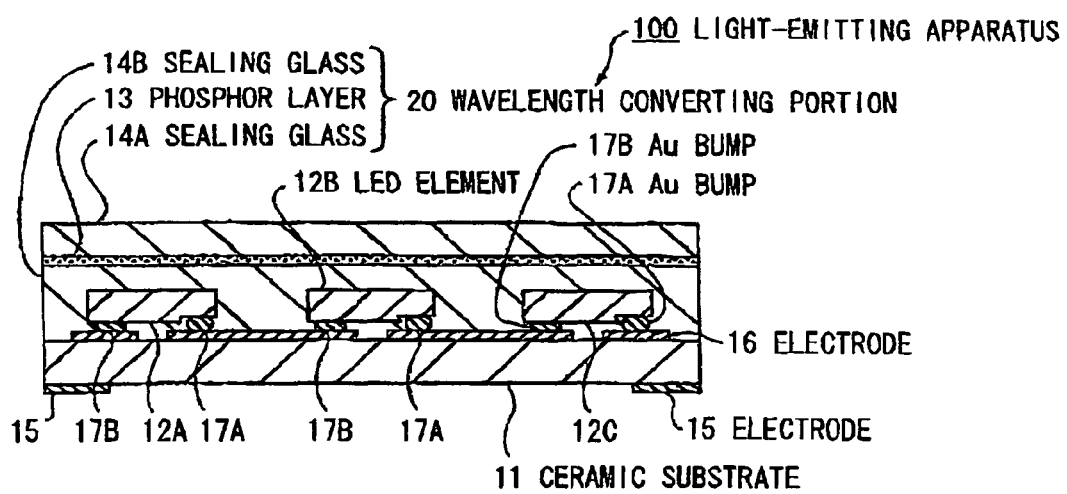
FIG. 13 is a cross sectional view showing a solid-state element device in a ninth preferred embodiment according to the invention.

FIG. 2 is a schematic view showing processes for fabricating the solid-state element device 1 in FIGS. 1A and 13. The LED element 12 is mounted on the ceramic substrate 11 in advance. The sealing glass 14 is constituted by two sheets of sealing glasses 14A and 14B made of the same material. The phosphor layer 13 is formed on the sealing glass 14B by performing application or screen printing.

A phosphor solution which is obtained by mixing a solvent with a phosphor containing therein a glass filler is formed like a thin film, thereby forming the thin film-like phosphor layer 13. The glass filler is a glass powder made of the same material as that of each of the sealing glasses 14A and 14B. The glass filler is molten in a phase of hot pressing processing in the glass sealing processing to disperse the phosphor into the glass.

The sealing glass 14A is stacked up on the sealing glass 14B having the phosphor layer 13 formed thereon so as to sandwich the phosphor layer 13 between the sealing glasses 14 and 14B. Also, the sealing glasses 14A and 14B are positioned above the LED element 12 so that the LED element 12 is located at a center of each of them. In this state, the hot pressing processing is performed by using a pair of molds (not shown), so that the LED element 12 is sealed as shown in FIG. 1A. Thus, the solid-state element device 1 is completed. Note that, the hot pressing processing is performed in vacuum ambient, which makes it possible to prevent bubbles from being generated in the wavelength converting portion 20.

According to the first embodiment of the invention, the following effects are obtained.

(1) In the phosphor layer 13, the mixing of the phosphor with the glass powder as the filler material results in that the glass is satisfactorily mixed with the phosphor, so that the phosphor is dispersed into the glass in the phase of the glass sealing. After that, the normal glass sealing processing is carried out. As a result, the property of the phosphor is prevented from being deteriorated since the sealing can be performed at a low temperature of about 600° C. at which no chemical reaction occurs between the sealing glass 14 and the phosphor in the phosphor layer 13. In addition, the mixing of the phosphor with the glass powder enhances the adhesiveness in the phase of the hot pressing sealing processing, which results in that it is possible to obtain the adhesiveness which is the same as that in the case where no glass is mixed with the phosphor.

(2) A white light can be obtained with only the single solid-state element device 1 because the phosphor layer 13 can be held inside the sealing glass 14.

Second Embodiment

Figure 3:
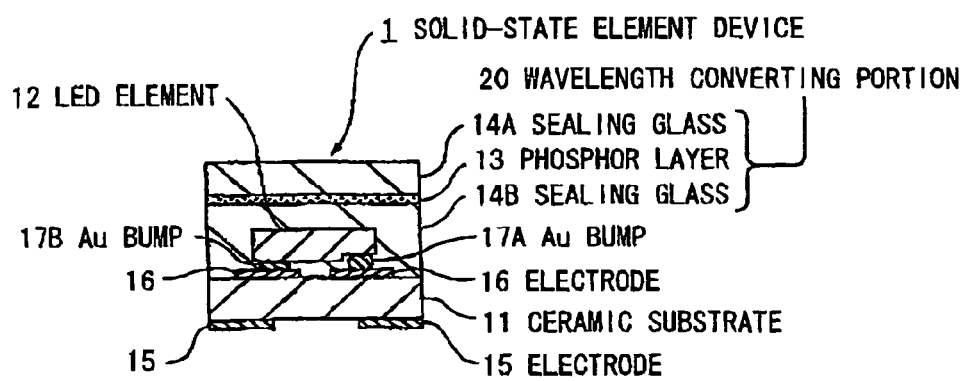
FIG. 3 is a cross sectional view showing a solid-state element device in a second preferred embodiment according to the invention.

FIG. 3 shows a solid-state element device in a second embodiment according to the invention. The solid-state element device 1 of the second embodiment adopts a construction in which the phosphor layer 13 extends to both the side end faces of each of the sealing glasses 14A and 14B in the first embodiment.

Note that, in the following descriptions, constituent elements having the same constructions and functions as those in the first embodiment are designated with the same reference numerals, respectively.

According to the second embodiment of the invention, even when the whole area of the upper surface of the solid-state element device 1 is made as the wavelength converting portion 20, the mixing of the phosphor with the glass powder similar to that in the first embodiment enhances the adhesiveness in the phase of the hot pressing sealing processing. Hence, the sealing property provided by the sealing glasses 14A and 14B can be prevented from being impaired. As a result, the light which is not wavelength-converted in the phosphor can be prevented from being radiated to the outside through the upper surface end portion.

Third Embodiment

Figure 4:
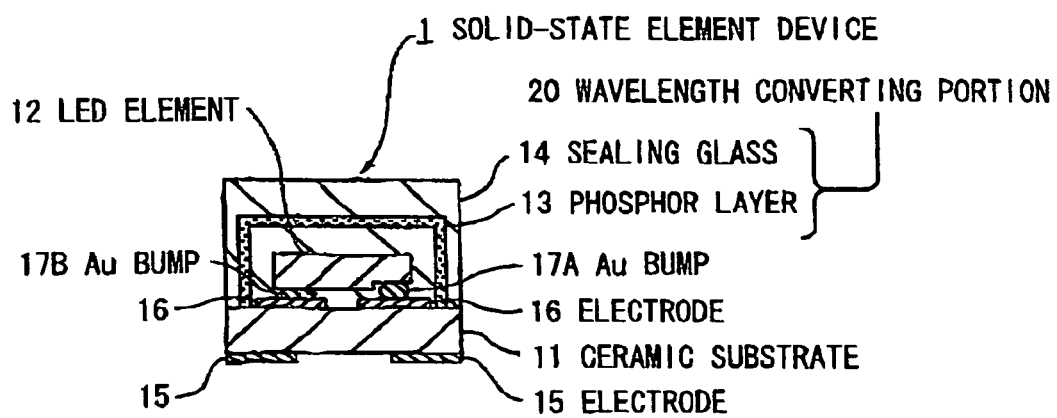
FIG. 4 is a cross sectional view showing a solid-state element device in a third preferred embodiment according to the invention.

FIG. 4 shows a solid-state element device in a third embodiment according to the invention. The solid-state element device 1 of the third embodiment adopts a construction in which the phosphor layer 13 surrounds the periphery of the sealing glass 14 in the first embodiment. Other constructions of the solid-state element device 1 of the third embodiment are the same as those of the solid-state element device 1 of the first embodiment.

According to the third embodiment of the invention, even the light which is attempting to be radiated through a side face of the sealing glass 14 can be wavelength-converted by the phosphor layer 13. In addition, the light is prevented from being transversely leaked, which results in that the measures to shield the leakage light can be made unnecessary.

Fourth Embodiment

Figure 5:
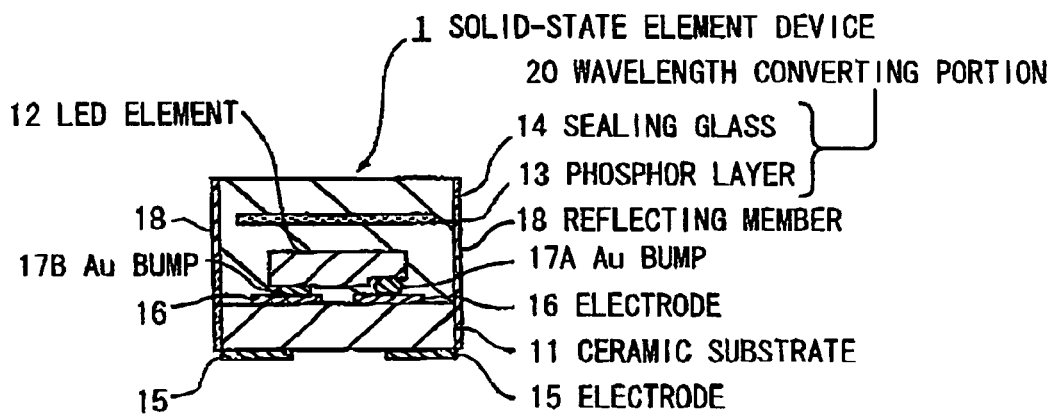
FIG. 5 is a cross sectional view showing a solid-state element device in a fourth preferred embodiment according to the invention.

FIG. 5 shows a solid-state element device in a fourth embodiment according to the invention. The solid-state element device 1 of the fourth embodiment adopts a construction in which a reflecting member 18 is provided on a side face of the sealing glass 14 of the solid-state element device 1 described in the first embodiment. Other constructions of the solid-state element device 1 of the fourth embodiment are the same as those of the solid-state element device 1 of the first embodiment.

The reflecting member 18 can be formed by performing plating of silver or the like, application of paint having a high reflection property, vacuum evaporation of a thin film, sticking of a sheet, or the like. Note that, a light shielding member or a phosphor layer may also be provided instead of the reflecting member 18.

According to the fourth embodiment of the invention, in addition to the desirable effects of the first embodiment, the following effect is obtained. That is to say, the light radiated through the side face of the sealing glass 14 is reflected to the inside by the reflecting member 18. Thus, the transverse leakage light which is not wavelength-converted by the phosphor layer 13 can be shielded so as not to be leaked to the outside. As a result, it is possible to enhance the efficiency of emitting the light from the sealing glass 14.

Fifth Embodiment

Figure 6:
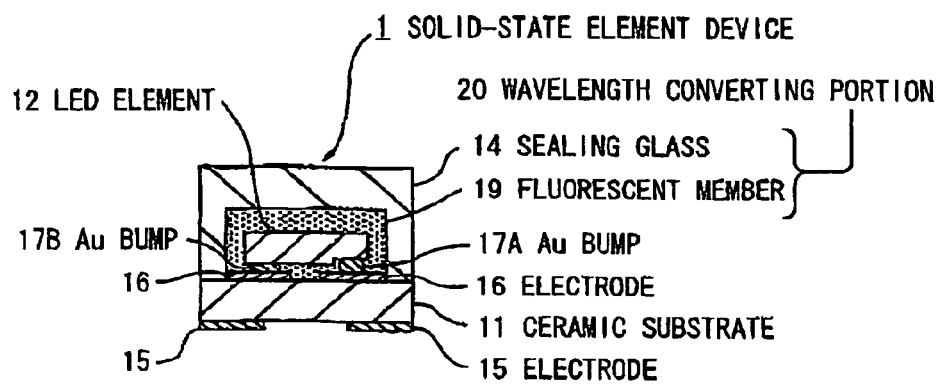
FIG. 6 is a cross sectional view showing a solid-state element device in a fifth preferred embodiment according to the invention.

FIG. 6 shows a solid-state element device in a fifth embodiment according to the invention. The solid-state element device 1 of the fifth embodiment adopts a construction in which a fluorescent member 19 is used as the member corresponding to the sealing glass 14B in the first embodiment shown in FIGS. 1A and 1B, and the LED element 12 is sealed with the fluorescent member 19 so that the fluorescent member 19 surrounds the whole LED element 12. Other constructions of the solid-state element device 1 of the fifth embodiment are the same as those of the solid-state element device 1 of the first embodiment.

The fluorescent member 19 is a glass containing therein a phosphor which is obtained by mixing a glass powder and a phosphor powder with each other, and performing the hot pressing. In order to prevent cracks or the like from occurring, a coefficient of thermal expansion of the glass material is desirably the same as that of the ceramic substrate 11.

Figure 7:
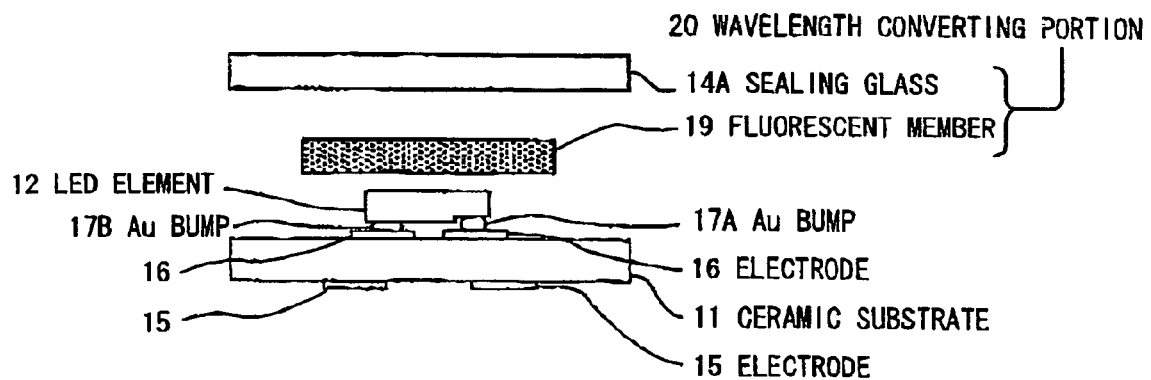
FIG. 7 is a schematic view showing processes for fabricating the solid-state element device in FIG. 6.

FIG. 7 is a schematic view showing processes for fabricating the solid-state element device 1 in FIG. 6. The LED element 12 is mounted on the ceramic substrate 11 in advance. The sealing glass 14A is stacked up on the fluorescent member 19 smaller in size than the sealing glass 14, and in this state, the sealing glass 14A and the fluorescent member 19 are positioned above the LED element 12. In this state, the hot pressing processing is performed by using a pair of molds (not shown). When the hot pressing processing and the making of the fluorescent member 19 are performed in the vacuum ambient, the bubbles can be prevented from being retained in the wavelength converting portion 20. In the manner as described above, the solid-state element device is completed in which as shown in FIG. 6, the LED element 12 is sealed with the fluorescent member 19, and the fluorescent member 19 is further sealed with the sealing glass 14.

According to the fifth embodiment of the invention, the following effects are obtained.

(1) The satisfactory adhesiveness to the sealing glass 14 can be obtained since the fluorescent member 19 is a mixture containing therein a glass.

(2) An amount of phosphor used can be reduced and the cost down can be realized since the wavelength converting portion 20 is constituted by the two constituent elements, that is, the sealing glass 14 and the fluorescent member 19.

(3) Since the whole LED element 12 is coated with the fluorescent member 19, almost the light radiated from the LED element 12 can be efficiently wavelength-converted and the apparent size of the light-emitting source can be prevented from increasing. This enhances the adaptability for applications each requiring the light condensing property.

Sixth Embodiment

Figure 8:
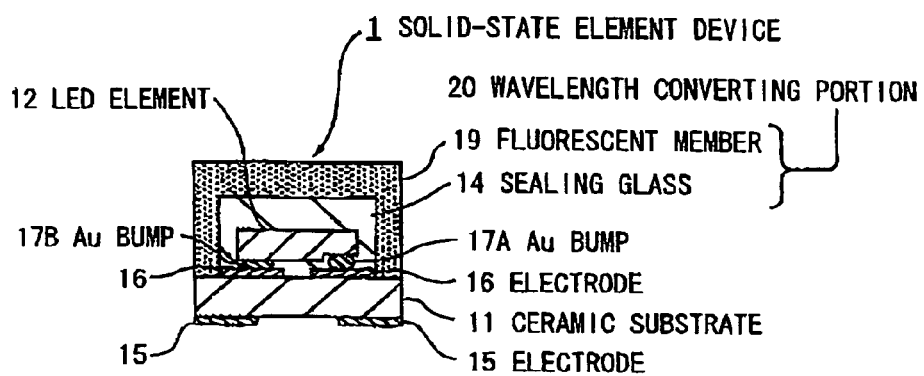
FIG. 8 is a cross sectional view showing a solid-state element device in a sixth preferred embodiment according to the invention.
Figure 9:
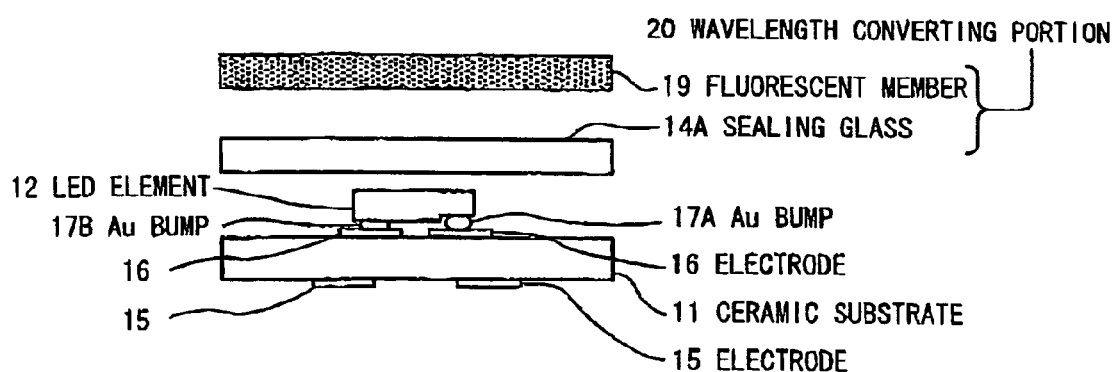
FIG. 9 is a schematic view showing processes for fabricating the solid-state element device in FIG. 8.

FIG. 8 shows a solid-state element device in a sixth embodiment according to the invention. In addition, FIG. 9 is a schematic view showing processes for fabricating the solid-state element device shown in FIG. 8.

The solid-state element device 1 of the sixth embodiment adopts a construction in which the sealing glass 14 and the fluorescent member 19 are interchanged in the fifth embodiment of FIG. 6. Other constructions of the solid-state element device 1 of the sixth embodiment are the same as those of the solid-state element device 1 of the fifth embodiment.

According to the sixth embodiment of the invention, the following effects are obtained.

(1) The sealing glass 14 is interposed between the fluorescent member 19 and the LED element 12, and thus the fluorescent member 19 is provided at a certain distance from the LED element 12. As a result, it is possible to lighten a damage of the fluorescent member 19 caused by the light emitted from the LED element 12.

(2) The side face portion of the LED element 12 is sealed with the fluorescent member 19, which results in that the measures to shield the light which is not wavelength-converted by the phosphor can be made unnecessary.

Seventh Embodiment

Figure 10:
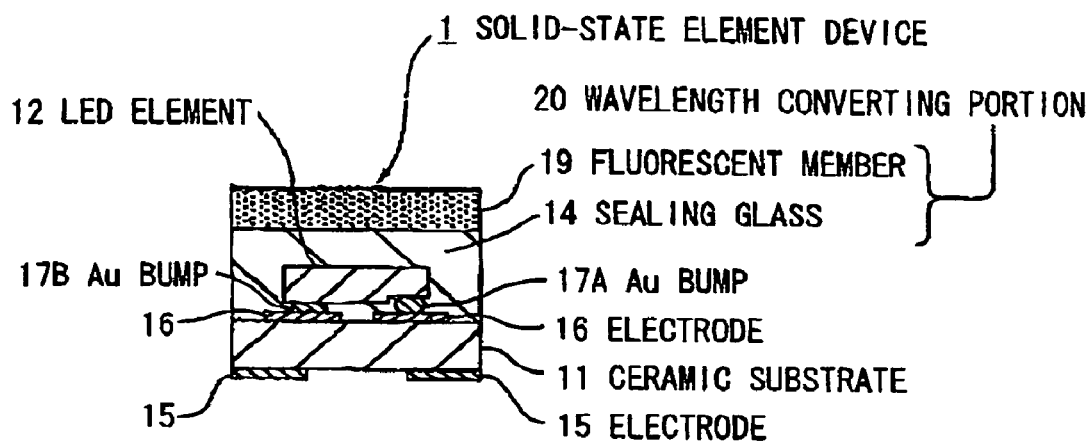
FIG. 10 is a cross sectional view showing a solid-state element device in a seventh preferred embodiment according to the invention.

FIG. 10 shows a solid-state element device in a seventh embodiment according to the invention.

The solid-state element device 1 of the seventh embodiment adopts a construction in which the fluorescent member 19 is provided only on an upper surface of the sealing glass 14 in the sixth embodiment of FIG. 8. Other constructions of the solid-state element device 1 of the seventh embodiment are the same as those of the solid-state element device 1 of the sixth embodiment.

According to the seventh embodiment of the invention, in addition to the desirable effects of the sixth embodiment, the following effect is obtained. That is to say, the side face of the LED element 12 is sealed with only the sealing glass 14, which makes it possible to simply perform the hot pressing processing without impairing the wavelength conversion property.

Eighth Embodiment

Figure 11:
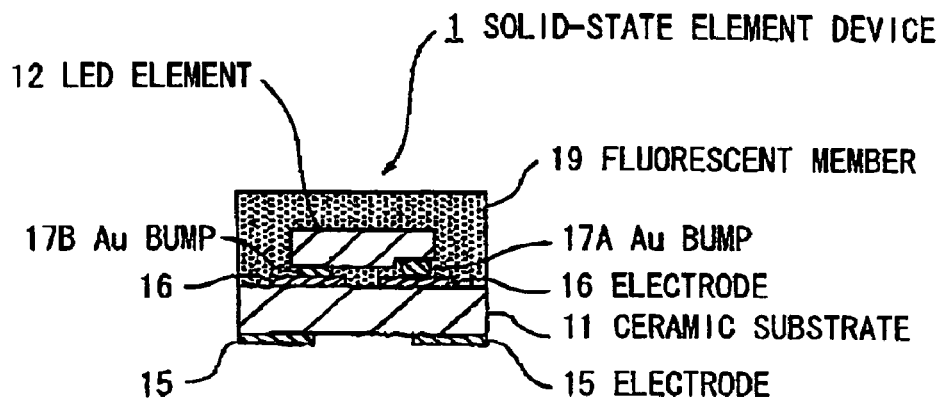
FIG. 11 is a cross sectional view showing a solid-state element device in a eighth preferred embodiment according to the invention.
Figure 12:
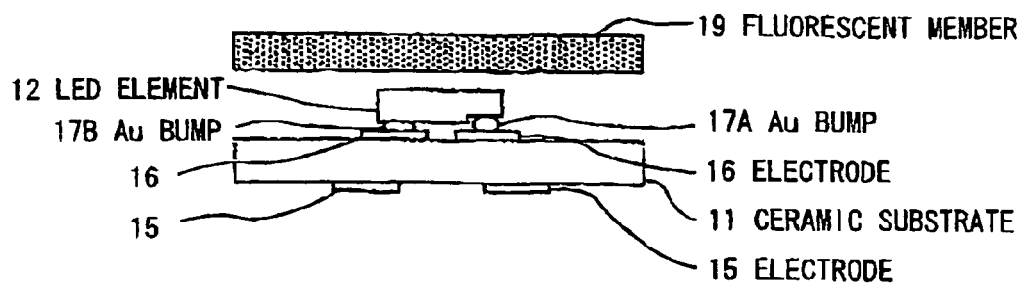
FIG. 12 is a schematic view showing processes for fabricating the solid-state element device in FIG. 11.

FIG. 11 shows a solid-state element device in an eighth embodiment according to the invention. In addition, FIG. 12 is a schematic view showing processes for fabricating the solid-state element device in FIG. 11.

In the solid-state element 1 of the eighth embodiment, the wavelength converting portion 20 is constituted by the fluorescent member 19. Also, as shown in FIG. 12, the hot pressing processing is performed with the plate-like fluorescent member 19 being positioned.

According to the eighth embodiment of the invention, the white solid-state element device 1 having a small sealing area can be formed because the LED element 12 is sealed with the fluorescent member 19. As a result, it is possible to obtain the solid-state element device 1 which has the less color shade and which is excellent in the sealing property. Note that, in order to suppress the color shade, a distance between the LED element 12 and the upper surface of the fluorescent member 19 is desirably made identical to that between the LED element 12 and the side face of the fluorescent member 19.

Ninth Embodiment

FIG. 13 shows a light-emitting apparatus in a ninth embodiment according to the invention. The light-emitting apparatus 100 of the ninth embodiment is constructed such that the solid-state element device 1 of the second embodiment shown in FIG. 3 is scaled up in an entire size, and a plurality of LED elements 12A to 12C are mounted on one sheet of ceramic substrate 11 and are sealed with the wavelength converting portion 20 in which the phosphor layer 13 is interposed between the sealing glasses 14A and 14B.

According to the ninth embodiment of the invention, since a plurality of solid-state element devices 12A to 12C are used as a light-emitting source, an emission intensity can be increased in addition to the desirable effects of the second embodiment. In addition, the light-emitting apparatus 100 having a desired emission intensity can be obtained by arbitrarily setting the number of LED elements to be used. Here, it is preferable in the light-emitting apparatus 100 having a plurality of LED elements installed therein that a heat radiating portion made of a material such as a metal having a satisfactory heat conduction property is provided as means for prompting the heat radiation accompanying the light emission of the LED elements on the side, of the light-emitting apparatus 100, having the ceramic substrate 11 mounted therein, and under this condition, the heat is discharged.

Tenth Embodiment

Figure 14:
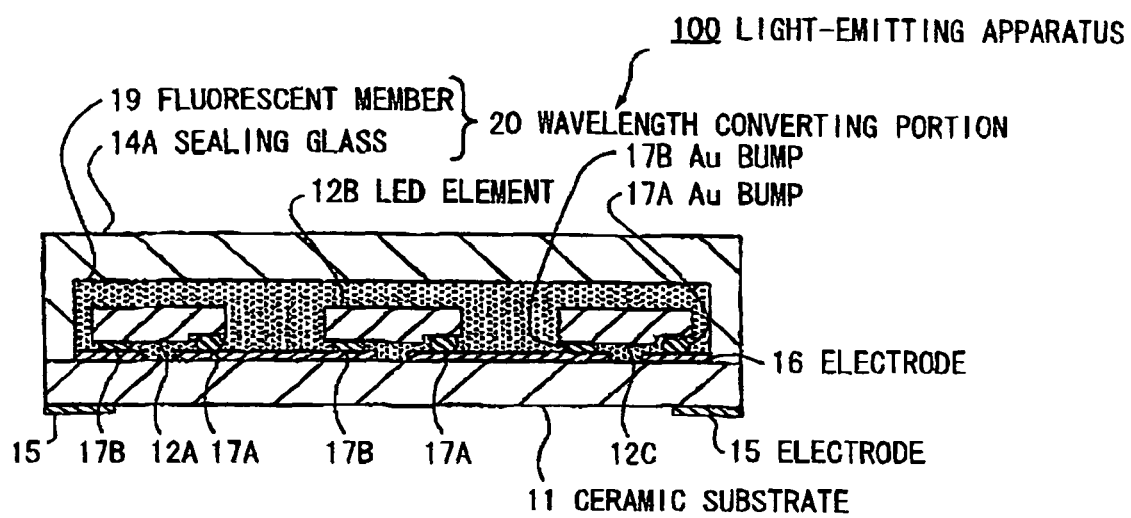
FIG. 14 is a cross sectional view showing a solid-state element device in a tenth preferred embodiment according to the invention.

FIG. 14 shows a light-emitting apparatus in a tenth embodiment according to the invention. The light-emitting apparatus 100 of the tenth embodiment, similarly to that of the ninth embodiment, is formed such that a plurality of LED elements 12A to 12C are mounted on the ceramic substrate 11, and are sealed with the wavelength converting portion 20 including the fluorescent member 19 and the sealing glass 14. Thus, a plurality of LED elements 12A to 12C are surrounded by the fluorescent member 19.

According to the tenth embodiment of the invention, the glass sealing of a plurality of LED elements 12A to 12C with the fluorescent member 19 results in that the highly reliable light-emitting device 100 is obtained because it can be given the satisfactory sealing property and wavelength conversion property for a long term without occurrence of the pealing-off due to the thermal expansion.

Eleventh Embodiment

Figure 15:
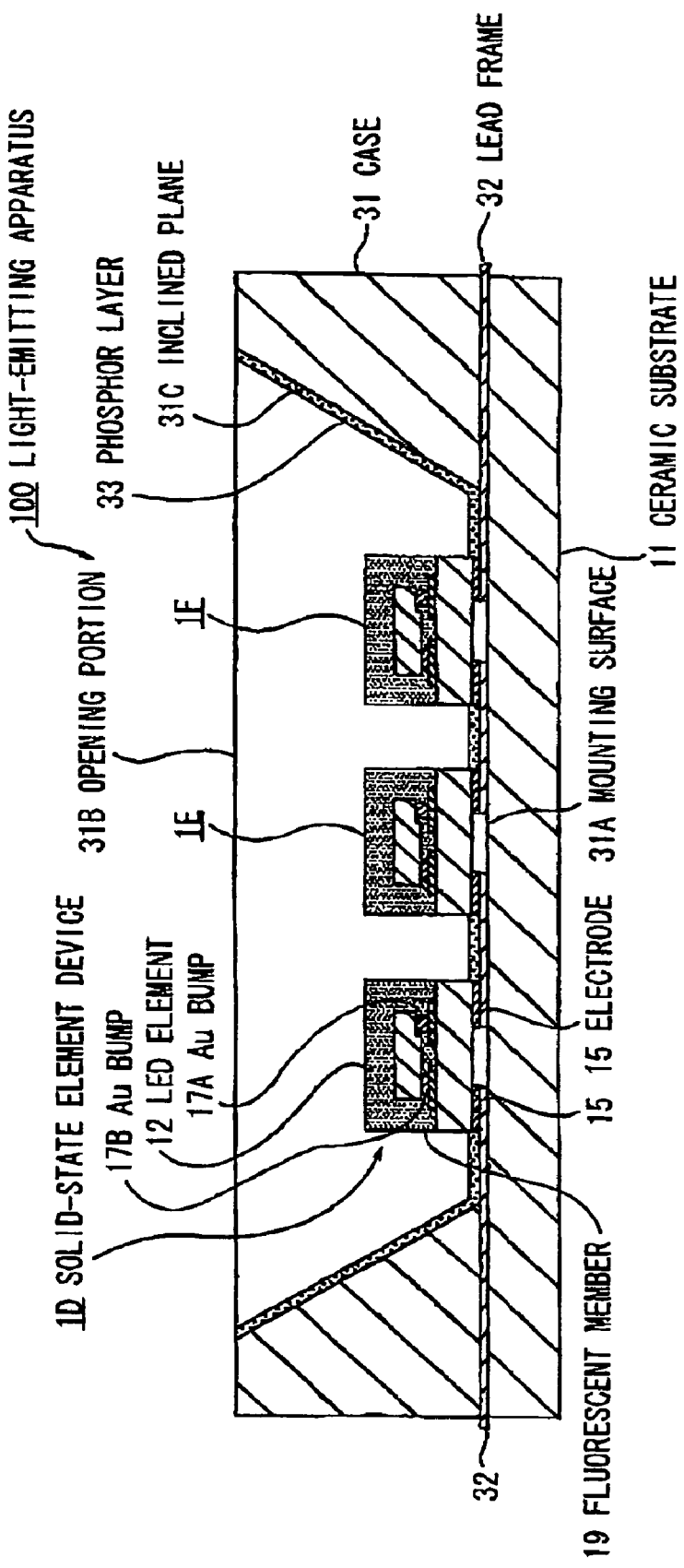
FIG. 15 is a cross sectional view showing a solid-state element device in an eleventh preferred embodiment according to the invention.

FIG. 15 shows a light-emitting apparatus in an eleventh embodiment according to the invention. The light-emitting apparatus 100 of the eleventh embodiment is constructed by using a plurality of solid-state element devices 1D to 1F each having the same construction as that of the solid-state element device 1 according to the eighth embodiment shown in FIG. 11.

The light-emitting apparatus 100 includes a case (main body) 31 made of a resin or the like and provided with an inclined plane 31C which spreads in area from a mounting surface 31A to an opening portion 31B, a lead frame (second power receiving/supplying portion) 32, made of copper or the like, which is provided in the case 31 so that its connection portions connected to the electrodes 15 of the solid-state element devices 1D to 1F, respectively, are exposed to the mounting surface 31A, and which is electrically connected to the ceramic substrate (first power receiving/supplying portion) 11 for the solid-state element devices 1D to 1F, a phosphor layer 33 provided on a surface of the inclined plane 31C, and the solid-state element devices 1D to 1F which are installed on the lead frame 32 exposed to the mounting surface 31A. Here, the surface of the inclined plane 31C can be sealed with a sealing member made of a glass or a resin when necessary. The structure of the phosphor layer 33 is the same as that of the phosphor layer 13 of the solid-state element device 1 of the first embodiment.

The lights radiated from the solid-state element devices 1D to 1F, respectively, are radiated to the outside through the opening portion 31B as they are. Also, the lights radiated through the side faces of the solid-state element devices 1D to 1F, respectively, are radiated to the outside after being absorbed and reflected by the phosphor layer 33.

According to the eleventh embodiment of the invention, the provision of the phosphor layer 33 on the inclined plane 31C of the case 31 results in that the phosphor contained in the phosphor layer 33 can absorb the lights radiated from the solid-state element devices 1D to 1F, respectively. Thus, it is possible to obtain the light-emitting apparatus 100 having the enhanced light condensing property and wavelength converting function.

Twelfth Embodiment

Figure 16:
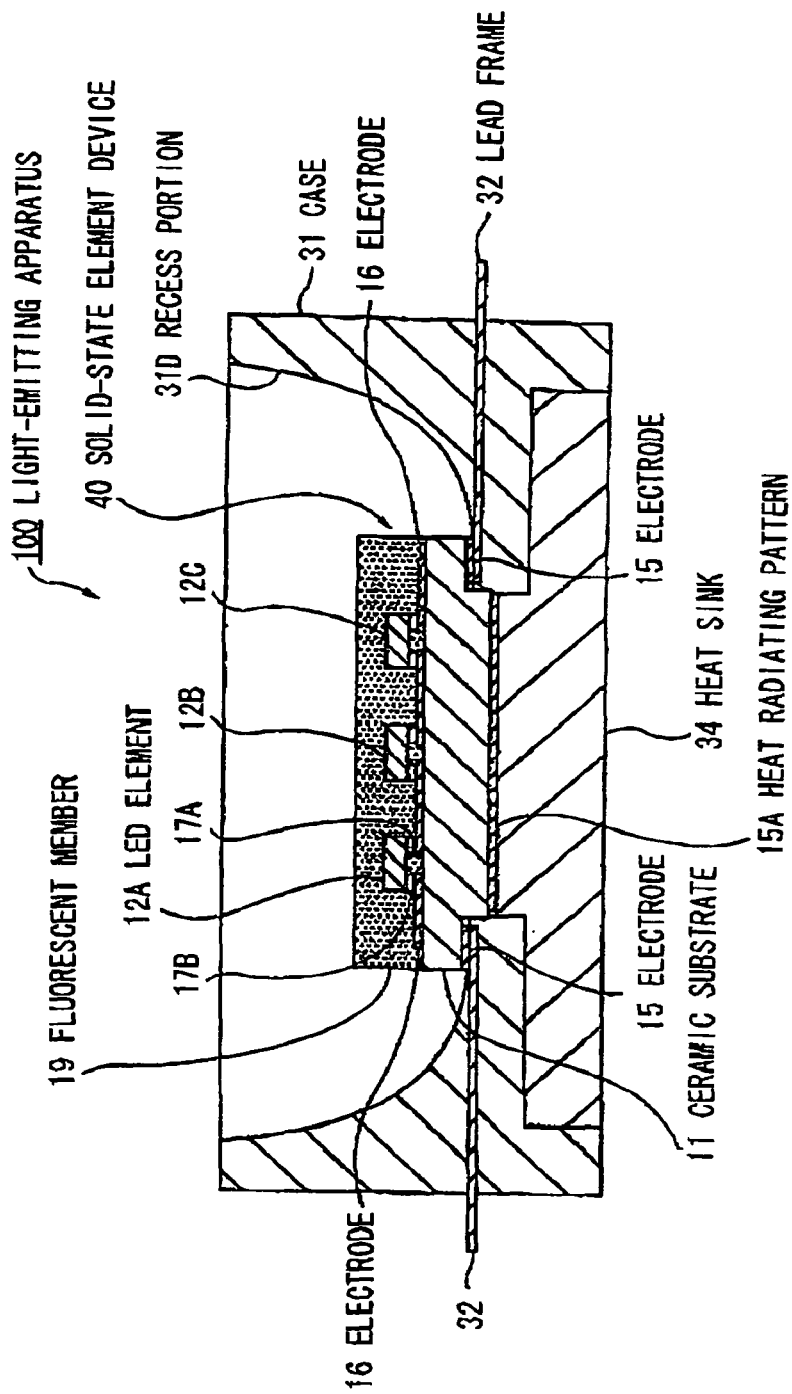
FIG. 16 is a cross sectional view showing a solid-state element device in a twelfth preferred embodiment according to the invention.

FIG. 16 shows a light-emitting apparatus in a twelfth embodiment according to the invention. In the light-emitting apparatus 100 of the twelfth embodiment, the LED elements 12A to 12C are disposed at predetermined intervals on the ceramic substrate 11 and are sealed with the fluorescent member 19, thereby constructing a solid-state element device 40. A recess portion 31D which is formed as a curved surface is provided in an inner surface of the case 31, and a heat sink 34 as a heat radiating member is disposed on the lower side of the recess portion 31D. Also, the heat sink 34 is joined to the ceramic substrate 11 through a heat radiating pattern 15A made of a copper foil.

For example, a white nylon resin can be processed into the case 31. In addition, a reflecting film or a phosphor layer can also be formed on the surface of the recess portion 31D when necessary.

The heat sink 34 is made of a metal, having an excellent heat conduction property, such as copper. A lower surface of the heat sink 34 has the same level as that of the lower surface of the case 31 or has a height which projects slightly from the lower surface of the case 31 so that the heat is radiated through a heat radiating member or the like when the heat sink 34 is installed in the heat radiating member or the like on the circuit board side.

According to the twelfth embodiment of the invention, the following effects are obtained.

(1) The provision of the heat sink 34 makes it possible to radiate the heat from the solid-state element device 40 during the driving.

(2) The solid-state element device 40 is used in which the LED elements 12A to 12C the number of which is set in correspondence to the required optical output are integrated with one another by using the fluorescent member 19 obtained by mixing the glass with the phosphor. As a result, the assembly processes can be simplified as compared with those for the light-emitting apparatus 100 including a plurality of solid-state element devices 1D to 1F in the eleventh embodiment shown in FIG. 15.

(3) Since the recess portion 31D is formed as the curved surface, the beam light (or a light close thereto) can be emitted upward in FIG. 16.

Other effects are the same as those of the first and eleventh embodiments.

Thirteenth Embodiment

Figure 17:
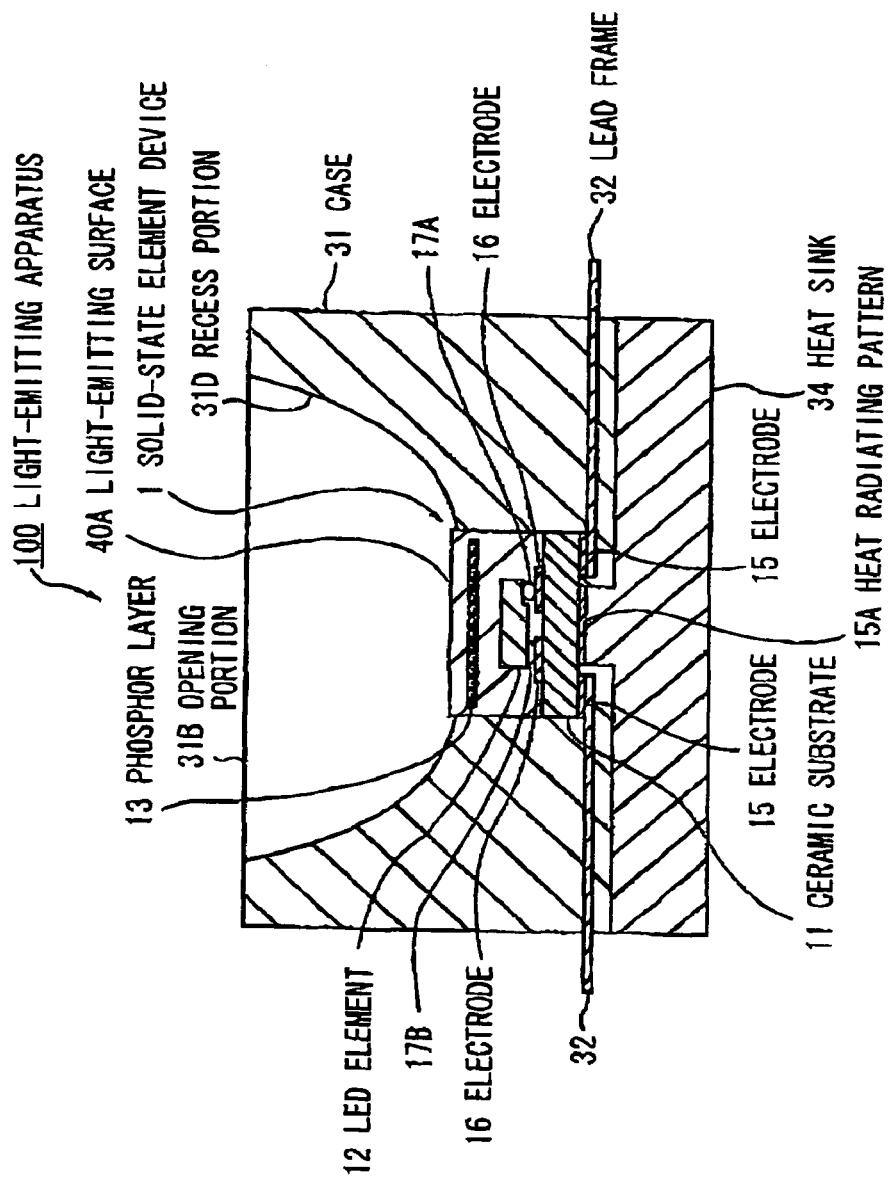
FIG. 17 is a cross sectional view showing a solid-state element device in a thirteenth preferred embodiment according to the invention.

FIG. 17 shows a light-emitting apparatus in a thirteenth embodiment according to the invention. The light-emitting apparatus 100 of the thirteenth embodiment adopts a construction in which the solid-state element device 1 having the construction shown in the first embodiment is used instead of the solid-state element device 40 described in the twelfth embodiment shown in FIG. 16, and the solid-state element device 1 is buried in the case 31 so that the recess portion 31D of the case 31 and the light-emitting surface of the solid-state element device 1 form a continuous surface. Other constructions of the light-emitting apparatus 100 of the thirteenth embodiment are the same as those of the light-emitting apparatus 100 of the twelfth embodiment.

The light emitted through the side face of the solid-state element device 1 is shielded by the side face of the case 31. Thus, the light emitted from the LED element 12 not only penetrates through the phosphor layer 13 to be emitted through the light-emitting surface 40A, but also is reflected by the resin of which the case 31 is made to be emitted through the light-emitting surface 40A.

According to the thirteenth embodiment of the invention, the following effects are obtained.

(1) The light obtained through the wavelength conversion can be efficiently radiated through the light-emitting surface 40A since the recess portion 31D has the curved surface, and forms the continuous surface with the light-emitting surface 40A of the solid-state element device 1 buried in the case 31.

(2) Although the solid-state element device 1 is buried in the case 31, the heat due to the light emission of the LED element 12 can be radiated through the heat sink 34. As a result, even when the solid-state element device 1 is of a high output type, a temperature rise can be suppressed.

Fourteenth Embodiment

Figure 18:
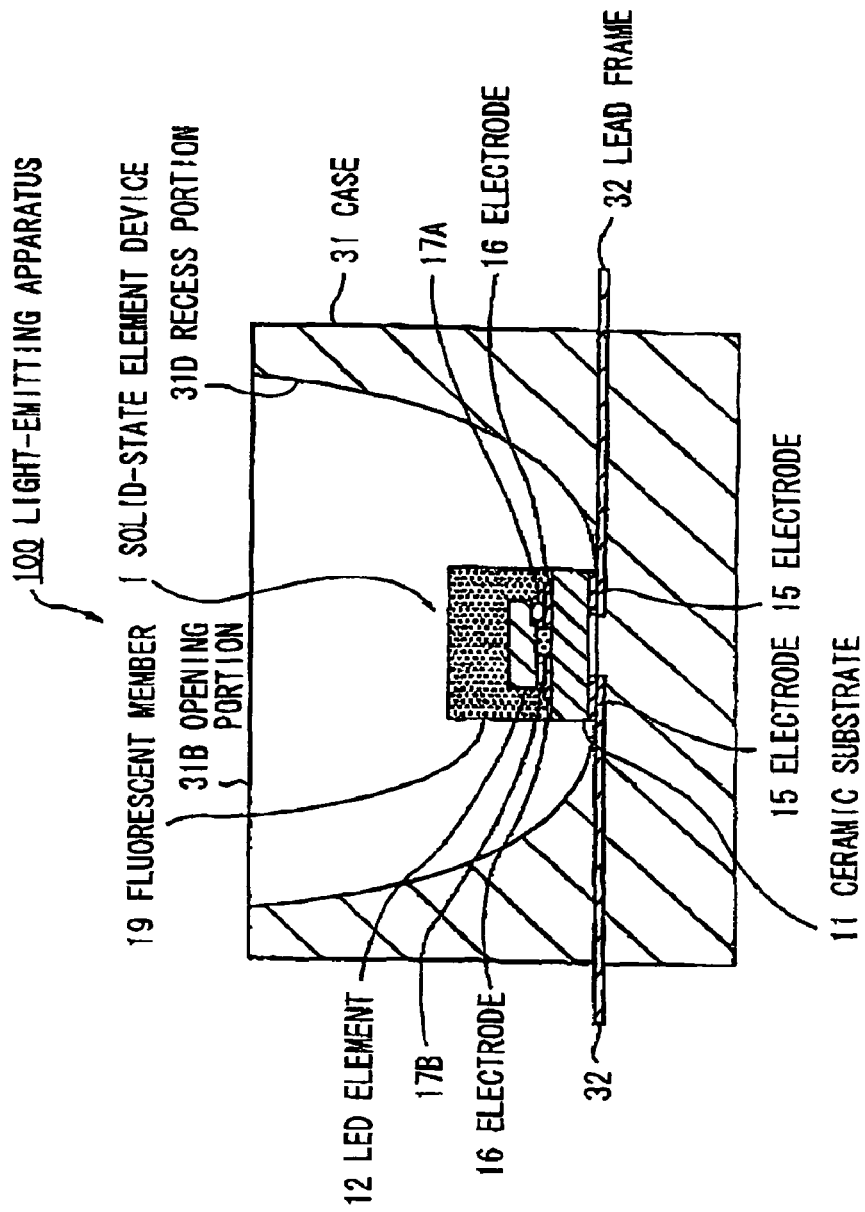
FIG. 18 is a cross sectional view showing a solid-state element device in a fourteenth preferred embodiment according to the invention.

FIG. 18 shows a light-emitting apparatus in a fourteenth embodiment according to the invention. The light-emitting apparatus 100 of the fourteenth embodiment adopts a construction in which the solid-state element device 1 described in the eighth embodiment shown in FIG. 11 is used, and the solid-state element device 1 is mounted to the case 31 having the recess portion 31D formed as the curved surface.

According to the fourteenth embodiment of the invention, the construction is adopted such that the light radiated from the solid-state element device 1 is reflected by the recess portion 31D formed as the curved surface and provided in the case 31 to be radiated. As a result, it is possible to enhance the radiation property of the light obtained through the wavelength conversion. In addition, since the solid-state element device 1 has the glass sealing construction, the LED element 12 is protected even when no solid-state element device 1 is sealed. As a result, the weight lightening, the reduction in the number of parts or components, the simplification of the fabrication processes, and the like can be realized.

Fifteenth Embodiment

Figure 19:
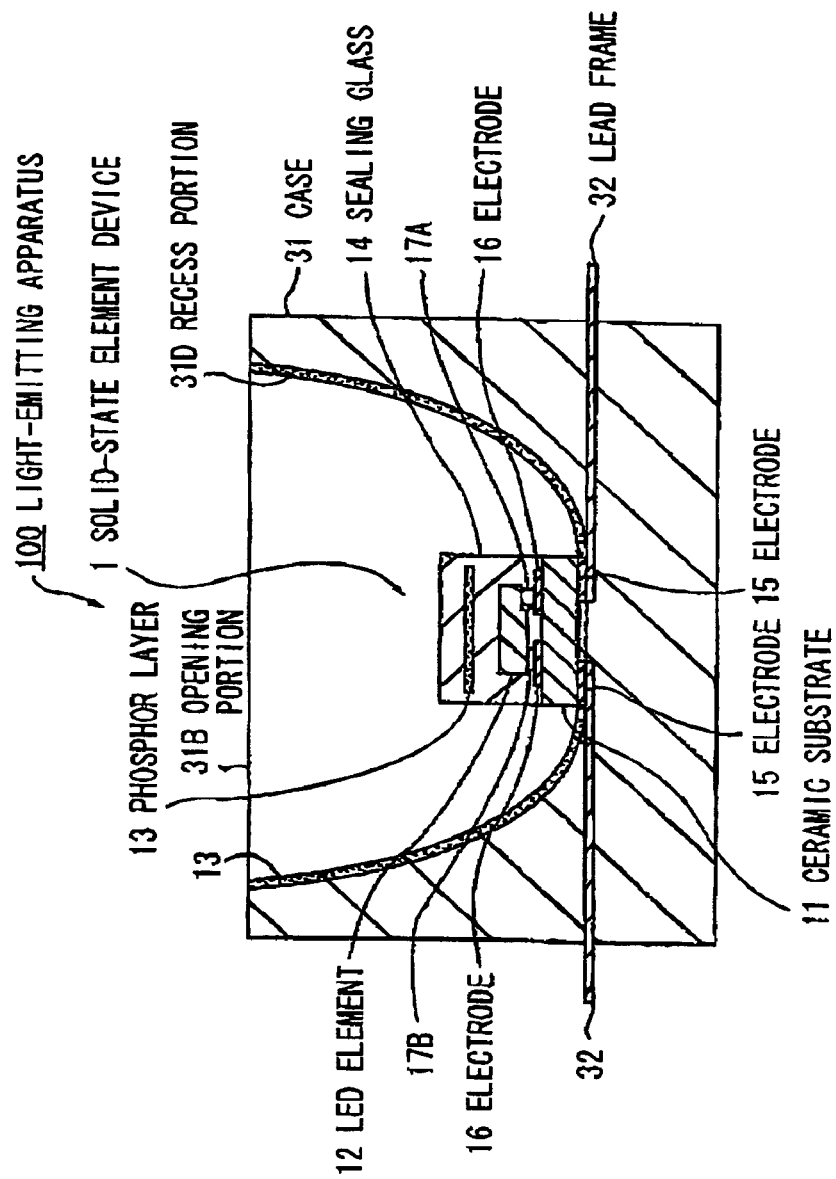
FIG. 19 is a cross sectional view showing a solid-state element device in a fifteenth preferred embodiment according to the invention

FIG. 19 shows a light-emitting apparatus in a fifteenth embodiment according to the invention.

In the light-emitting apparatus 100 of the fifteenth embodiment, the phosphor layer 13 is provided on the surface of the recess portion 31D formed as the curved surface and described in the fourteenth embodiment, and the solid-state element device 1 described in the first embodiment is installed.

According to the fifteenth embodiment of the invention, since the phosphor layer 13 absorbs the light radiated through the side face of the solid-state element device 1, the light radiated through the side face can be wavelength-converted even in the case of the solid-state element device 1 having no phosphor layer on the side face of the solid-state element device 1.

Other Embodiments

It should be noted that the invention is not intended to be limited to the above-mentioned embodiments, and the various changes can be made without departing from or changing the technical idea of the invention.

For example, in each of the above-mentioned solid-state element devices 1, the wavelength converting portion 20 or the fluorescent member 19 may be one which has an optical shape having the light condensing property or the light diffusion property.

In addition, a single or plurality of LED elements may be used in the solid-state element device. Although the construction using the three LED elements has been described in each of the ninth to twelfth embodiments, the number of LED elements can be arbitrarily set in correspondence to the required optical output.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set fourth.

What is claimed is:

1. A solid-state element device, comprising:
a solid-state element;
a power receiving/supplying portion for mounting thereto said solid-state element, and receiving/supplying a power from/to said solid-state element; and
a wavelength converting portion having a phosphor layer formed inside a sealing glass having the same coefficient of thermal expansion as that of said power receiving/supplying portion for sealing said solid-state element, said phosphor layer being obtained by mixing glass powders and phosphor powders with each other, and melting the glass.

2. A solid-state element device according to claim 1, wherein said solid-state element comprises an LED element comprising a GaN system semiconductor compound.

3. A light-emitting apparatus, wherein a plurality of solid-state element devices according to claim 2 are disposed on a common power receiving/supplying portion so that light radiation directions are identical to one another.

4. A light-emitting apparatus, comprising:
a solid-state element device according to claim 2;
a second power receiving/supplying portion for mounting thereto the solid-state element device or a plurality of solid-state element devices, and receiving/supplying a power from/to a first power receiving/supplying portion for said solid-state element device or said plurality of solid-state element devices; and
a main body for accommodating therein said solid-state element device or said plurality of solid-state element devices and said second power receiving/supplying portion.

5. A light-emitting apparatus according to claim 4, wherein said main body comprises a recess portion through which said solid-state element device or said plurality of solid-state element devices are exposed.

6. A light-emitting apparatus according to claim 5, wherein said recess portion comprises a phosphor layer, or a reflecting film provided in an inner surface of said recess portion.

7. A light-emitting apparatus according to claim 4, wherein said main body comprises a heat radiating portion for radiating heat from said solid-state element device or said plurality of solid-state element devices to an outside of said main body.

8. A light-emitting apparatus, wherein a plurality of solid-state element devices according to claim 1 are disposed on a common power receiving/supplying portion so that light radiation directions are identical to one another.

9. A light-emitting apparatus, comprising:
a solid-state element device according to claim 1;
a second power receiving/supplying portion for mounting thereto the solid-state element device or a plurality of solid-state element devices, and receiving/supplying a power from/to a first power receiving/supplying portion for said solid-state element device or said plurality of solid-state element devices: and
a main body for accommodating therein said solid-state element device or said plurality of solid-state element devices and said second power receiving/supplying portion.

10. A light-emitting apparatus according to claim 9, wherein said main body has a recess portion through which said solid-state element device or said plurality of solid-state element devices are exposed.

11. A light-emitting apparatus according to claim 10, wherein said recess portion comprises a phosphor layer, or a reflecting film provided in an inner surface of said recess portion.

12. A light-emitting apparatus according to claim 9, wherein said main body comprises a heat radiating portion for radiating heat from said solid-state element device or said plurality of solid-state element devices to an outside of said main body.

13. A solid-state element device according to claim 1, wherein the phosphor powders are uniformly dispersed in the glass.

14. A solid-state element device according to claim 1, wherein sealing of the sealing glass is performed at a temperature at which no chemical reaction occurs between the sealing glass and a phosphor in the phosphor layer.

15. A solid-state element device according to claim 14, wherein said temperature is about 600° C.

16. A solid-state element device, comprising:
a solid-state element;
a power receiving/supplying portion for mounting thereto said solid-state element, and receiving/supplying a power from/to said solid-state element; and
a wavelength converting portion having a fluorescent layer obtained by mixing glass powders and phosphor powders with each other, and melting the glass, said fluorescent layer being provided so as to divide an inside or an outside of a sealing glass for sealing said solid-state element into two parts, or being formed so as to seal whole sealing glass.

17. A solid-state element device according to claim 16, wherein said solid-state element comprises an LED element comprising a GaN system semiconductor compound.

18. A solid-state element device according to claim 16, wherein the phosphor powders are uniformly dispersed in the glass.

19. A solid-state element device according to claim 16, wherein sealing of the sealing glass is performed at a temperature at which no chemical reaction occurs between the sealing glass and a phosphor in the phosphor layer.

20. A solid-state element device according to claim 19, wherein said temperature is about 600° C.

* * * * *